United States Patent
Wang et al.

(10) Patent No.: US 12,426,363 B2
(45) Date of Patent: Sep. 23, 2025

(54) METHOD FOR MANUFACTURING DISPLAY PANEL, DISPLAY PANEL AND TO-BE-CUT DISPLAY PANEL

(71) Applicants: Hefei Xinsheng Optoelectronics Technology Co., Ltd., Anhui (CN); BOE Technology Group Co., Ltd., Beijing (CN)

(72) Inventors: Haitao Wang, Beijing (CN); Ming Wang, Beijing (CN); Jun Cheng, Beijing (CN); Bin Zhou, Beijing (CN); Jun Wang, Beijing (CN); Yongchao Huang, Beijing (CN); Tongshang Su, Beijing (CN); Qinghe Wang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 189 days.

(21) Appl. No.: 17/913,808

(22) PCT Filed: Oct. 26, 2021

(86) PCT No.: PCT/CN2021/126405
§ 371 (c)(1),
(2) Date: Sep. 22, 2022

(87) PCT Pub. No.: WO2022/199014
PCT Pub. Date: Sep. 29, 2022

(65) Prior Publication Data
US 2024/0213278 A1    Jun. 27, 2024

(30) Foreign Application Priority Data
Mar. 22, 2021    (CN) .......................... 202110304206.3

(51) Int. Cl.
H10D 86/60    (2025.01)
H10D 86/01    (2025.01)
H10D 86/40    (2025.01)

(52) U.S. Cl.
CPC ....... H10D 86/0231 (2025.01); H10D 86/441 (2025.01); H10D 86/60 (2025.01)

(58) Field of Classification Search
CPC .. H10K 50/844; H10K 59/131; H10K 77/111; H10K 50/805; H10K 50/852;
(Continued)

(56) References Cited

U.S. PATENT DOCUMENTS

2018/0019263 A1*  1/2018  Kong ..................... H10D 86/60
2021/0143183 A1   5/2021  Zhang et al.

FOREIGN PATENT DOCUMENTS

CN    101145567 A    3/2008
CN    203616554 U    5/2014
(Continued)

OTHER PUBLICATIONS

CN202110304206.3 first office action.
CN202110304206.3 Notification to grant patent right for invention.

*Primary Examiner* — Moin M Rahman
(74) *Attorney, Agent, or Firm* — IPro, PLLC

(57) ABSTRACT

Provided is a method for manufacturing a display panel. The method includes: forming a first electrostatic protective circuit and a source and drain conductive pattern on a base substrate, the base substrate including a target cutting region, wherein the target cutting region is overlapped with an orthographic projection of the first electrostatic protective circuit on the base substrate, and the target cutting region is overlapped with an orthographic projection of the source and drain conductive pattern on the base substrate; removing the source and drain conductive pattern within the target cutting region; forming a to-be-cut display panel by forming
(Continued)

a superstructure on the base substrate; and cutting the to-be-cut display panel in the target cutting region.

17 Claims, 8 Drawing Sheets

(58) Field of Classification Search
CPC .. H10K 50/856; H10K 59/12; H10K 50/8445; H10K 50/85; H10K 59/10; H10K 59/129; H10K 2101/00; H10K 2102/311; H10K 2102/361; H10K 71/00; H10K 10/46–491; H10K 50/30; H10K 19/10; H10K 59/125; H10K 10/481–482; H10K 10/464; H10K 10/466; H10K 10/84; H10K 50/11; H10K 50/15; H10K 50/16; H10K 50/171; H10K 2101/30; H10K 2101/40; H10K 2102/351; H10K 59/35; H10K 50/156; H10K 85/615; H10K 85/624; H10K 85/626; H10K 85/631; H10K 85/633; H10K 85/636; H10K 85/6572; H10K 50/155; H10K 50/115; H10K 50/13; H10K 50/80; H10K 85/6574; H10K 59/873; G02F 1/133305; G02F 1/133388; G02F 1/13452; G02F 1/136254; G02F 2201/50; G02F 2202/28; H01L 2224/73204; Y02E 10/549; G09G 2300/0426; H10D 30/67–6759; H10D 30/031–0327; H10D 86/021–0251; H10D 30/6728; H10D 86/40; H10D 86/60; B60K 37/02; B60K 2370/1523; B60K 2370/331; B60K 2370/52; B60R 1/00
See application file for complete search history.

(56) References Cited

FOREIGN PATENT DOCUMENTS

| | | | |
|---|---|---|---|
| CN | 107505747 | A | 12/2017 |
| CN | 108511394 | A | 9/2018 |
| CN | 108711565 | A | 10/2018 |
| CN | 113066803 | A | 7/2021 |
| JP | H1168110 | A | 3/1999 |
| JP | 2009095962 | A | 5/2009 |
| KR | 20030058221 | A | 7/2003 |
| WO | 2019227698 | A1 | 12/2019 |

* cited by examiner

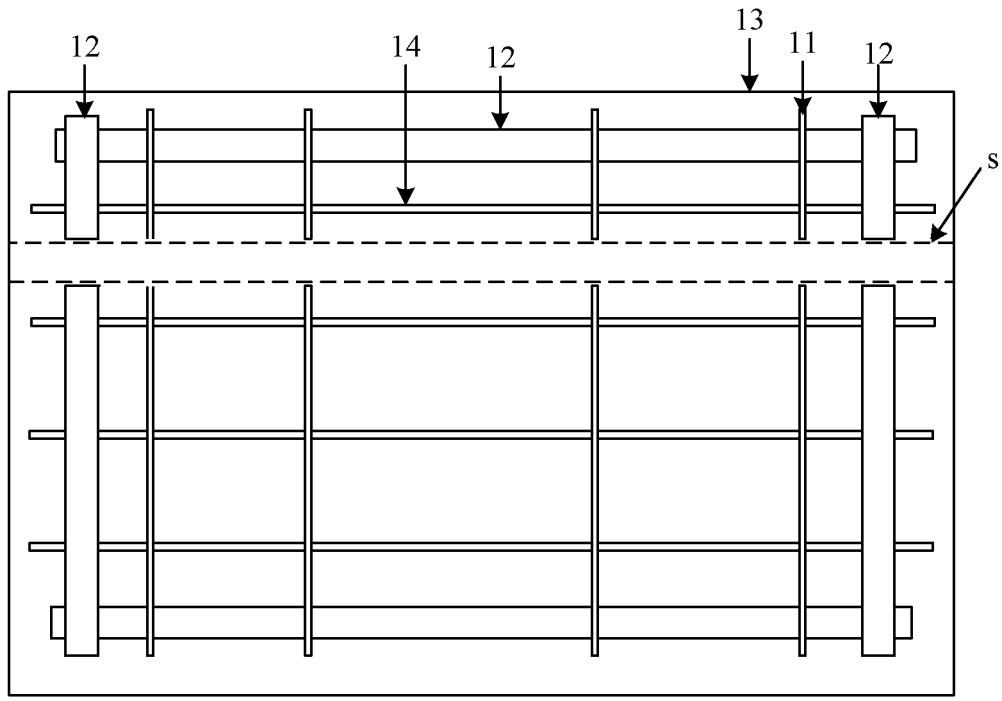

FIG. 1

```
┌─────────────────────────────────────────────────────┐
│ Forming a first electrostatic protective circuit and a source and drain │
│ conductive pattern on a base substrate, wherein the base substrate      │    201
│ includes a target cutting region, the target cutting region is overlapped │
│ with an orthographic projection of the first electrostatic protective circuit │
│ on the base substrate, and the target cutting region is overlapped with an │
│ orthographic projection of the source and drain conductive pattern on the │
│ base substrate                                                         │
└─────────────────────────────────────────────────────┘
                              │
                              ▼
┌─────────────────────────────────────────────────────┐
│ Removing the source and drain conductive pattern within the target │    202
│ cutting region                                                    │
└─────────────────────────────────────────────────────┘
                              │
                              ▼
┌─────────────────────────────────────────────────────┐
│ Forming a to-be-cut display panel by forming a superstructure on the │    203
│ base substrate                                                      │
└─────────────────────────────────────────────────────┘
                              │
                              ▼
┌─────────────────────────────────────────────────────┐
│ Cutting the to-be-cut display panel in the target cutting region │    204
└─────────────────────────────────────────────────────┘
```

FIG. 2

METHOD FOR MANUFACTURING DISPLAY PANEL, DISPLAY PANEL AND TO-BE-CUT DISPLAY PANEL

CROSS-REFERENCE TO RELATED APPLICATION

This application is a U.S. national phase application based on PCT/CN2021/126405, filed on Oct. 26, 2021, which claims priority to the Chinese Patent Application No. 202110304206.3, filed on Mar. 22, 2021, and entitled "METHOD FOR MANUFACTURING DISPLAY PANEL, DISPLAY PANEL AND TO-BE-CUT DISPLAY PANEL," the disclosure of which are incorporated herein by reference in their entireties.

TECHNICAL FIELD

The present disclosure relates to the field of display technologies, and in particular, relates to a method for manufacturing a display panel, a display panel and a to-be-cut display panel.

BACKGROUND

A display panel is a device with a display function. Display panels are available in a wide variety of sizes, and different sizes of display panels are usually manufactured using different mask broads. In order to reduce the number of mask boards, one way is to manufacture a display panel by a set of mask boards, and then cut the display panel to manufacture multiple sizes of display panels.

SUMMARY OF THE UTILITY MODEL

Embodiments of the present disclosure provide a method for manufacturing a display panel, a display panel and a to-be-cut display panel. The technical solutions are as follows.

According to some embodiments of the present disclosure, a method for manufacturing a display panel is provided. The method includes:

forming a first electrostatic protective circuit and a source and drain conductive pattern on a base substrate, the base substrate including a target cutting region, wherein the target cutting region is overlapped with an orthographic projection of the first electrostatic protective circuit on the base substrate, and the target cutting region is overlapped with an orthographic projection of the source and drain conductive pattern on the base substrate;

removing the source and drain conductive pattern within the target cutting region;

forming a to-be-cut display panel by forming a superstructure on the base substrate; and cutting the to-be-cut display panel in the target cutting region.

Optionally, the base substrate includes a display region and a peripheral region disposed at a periphery of the display region, and removing the source and drain conductive pattern within the target cutting region includes:

removing a pattern, within a first overlapping region, in the source and drain conductive pattern, wherein the first overlapping region is an overlapping region between the display region and the target cutting region: and removing a pattern, within a second overlapping region, in the source and drain conductive pattern by laser, wherein the second overlapping region is an overlapping region between the peripheral region and the target cutting region.

Optionally, removing the source and drain conductive pattern, within the first overlapping region, in the source and drain conductive pattern includes:

removing the pattern, within the first overlapping region, in the source and drain conductive pattern by a one-time patterning process.

Optionally, removing the pattern, within the first overlapping region, in the source and drain conductive pattern by the one-time patterning process includes:

forming a photoresist layer on the base substrate on which the source and drain conductive pattern is formed;

acquiring a first photoresist pattern by exposing and developing, using a pixel electrode mask board as a mask, the first overlapping region, wherein the first photoresist pattern includes an opening within the first overlapping region;

removing the pattern, within the first overlapping region, in the source and drain conductive pattern by etching, using the first photoresist pattern as a protective layer, the source and drain conductive pattern: and stripping the first photoresist pattern.

Optionally, the source and drain conductive pattern includes a plurality of data lines arranged in a first direction, wherein the target cutting region is overlapped with orthographic projections of the plurality of data lines on the base substrate, the first electrostatic protective circuit is disposed on both sides of the plurality of data lines in the first direction: and removing the source and drain conductive pattern within the target cutting region includes:

removing a portion of a first data line, within the target cutting region, of the plurality of data lines by a one-time patterning process, wherein the first data line is a data line, of the plurality of data lines, having a minimum distance from the first electrostatic protective circuit that is greater than a specified value: and removing portions, within the target cutting region, of the other data lines other than the first data line by laser.

Optionally, the source and drain conductive pattern includes a plurality of data lines, and the target cutting region is overlapped with orthographic projections of the plurality of data lines on the base substrate: and removing the source and drain conductive pattern, within the first overlapping region, in the source and drain conductive pattern includes:

removing data lines, within the first overlapping region, of the source and drain conductive pattern.

Optionally, prior to removing the source and drain conductive pattern within the target cutting region, the method further includes:

acquiring test data by performing a test on the base substrate: and repairing the base substrate based on the test data.

Optionally, prior to forming the first electrostatic protective circuit and the source and drain conductive pattern on the base substrate, the method further includes:

forming a second electrostatic protective circuit on the base substrate;

forming the first electrostatic protective circuit and the source and drain conductive pattern on the base substrate includes:

forming a first insulative layer on the base substrate on which the second electrostatic protective circuit is formed;

forming a first via hole in the first insulative layer, wherein the second electrostatic protective circuit includes an exposed region at the first via hole;

forming a source and drain conductive film layer on the base substrate on which the first insulative layer is formed; and treating the source and drain conductive film layer by a patterning process into the first electrostatic protective circuit and the source and drain conductive pattern, wherein the first electrostatic protective circuit is electrically connected to the second electrostatic protective circuit via the first via hole.

Optionally, forming the first electrostatic protective circuit and the source and drain conductive pattern on the base substrate includes:

forming a source and drain conductive film layer on the base substrate; and treating the source and drain conductive film layer into the first electrostatic protective circuit and the source and drain conductive pattern by a one-time patterning process.

Optionally, prior to forming the first electrostatic protective circuit and the source and drain conductive pattern on the base substrate, the method further includes:

successively forming an active layer and a gate insulative layer covering the active layer on the base substrate;

forming a gate conductive film layer on the base substrate on which the gate insulative layer is formed;

forming a second photoresist pattern on the gate conductive film layer;

forming a gate conductive pattern including a gate by etching the gate conductive film layer using the second photoresist pattern as a protective layer, wherein an orthographic projection of the gate on the base substrate is within an orthographic projection of the active layer on the base substrate;

exposing a connection region of the active layer by etching the gate insulative layer using the second photoresist pattern as a protective layer, wherein an orthographic projection of the connection region on the base substrate is not overlapped with the orthographic projection of gate on the base substrate;

conducting a conductor transformation treatment on the connection region of the active layer; and removing the second photoresist pattern.

Optionally, prior to successively forming the active layer and the gate insulative layer covering the active layer on the base substrate, the method further includes:

forming a light shielding film layer on the base substrate;

acquiring a light shielding pattern by treating the light shielding film layer by a patterning process, wherein the light shielding pattern includes a light shielding region and an opening region: and forming a buffer layer on the base substrate on which the light shielding pattern is formed;

wherein successively forming the active layer and the gate insulative layer covering the active layer on the base substrate includes:

successively forming the active layer and the gate insulative layer covering the active layer on the buffer layer, wherein an orthographic projection of the active layer on the base substrate is within an orthographic projection of the light shielding region of the light shielding pattern on the base substrate.

Optionally, cutting the to-be-cut display panel in the target cutting region includes:

cutting the first electrostatic protective circuit as well as the to-be-cut display panel in the target cutting region by cutting the to-be-cut display panel in the target cutting region.

According to some embodiments of the present disclosure, a display panel is provided. The display panel includes a display panel manufactured by the method of any one of the above embodiments.

According to some embodiments of the present disclosure, a to-be-cut display panel is provided. The to-be-cut display panel includes:

a base substrate, including a target cutting region;

a first electrostatic protective circuit and a source and drain conductive pattern disposed on the base substrate, wherein the target cut region is overlapped with an orthographic projection of the first electrostatic protective circuit on the base substrate, and the target cut region is not overlapped with an orthographic projection of the source and drain conductive pattern on the base substrate; and a superstructure disposed on the first electrostatic protective circuit and the source and drain conductive pattern.

Optionally, the to-be-cut display panel further includes a second electrostatic protective circuit, wherein the second electrostatic protective circuit is electrically connected to the first electrostatic protective circuit.

BRIEF DESCRIPTION OF THE DRAWINGS

In order to describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art can still derive other drawings from these accompanying drawings without creative efforts.

FIG. 1 is a schematic diagram of a structure of a base substrate according to the disclosed technology;

FIG. 2 is a flowchart of a method for manufacturing a display panel according to some embodiments of the present disclosure;

DETAILED DESCRIPTION

Figure 3:
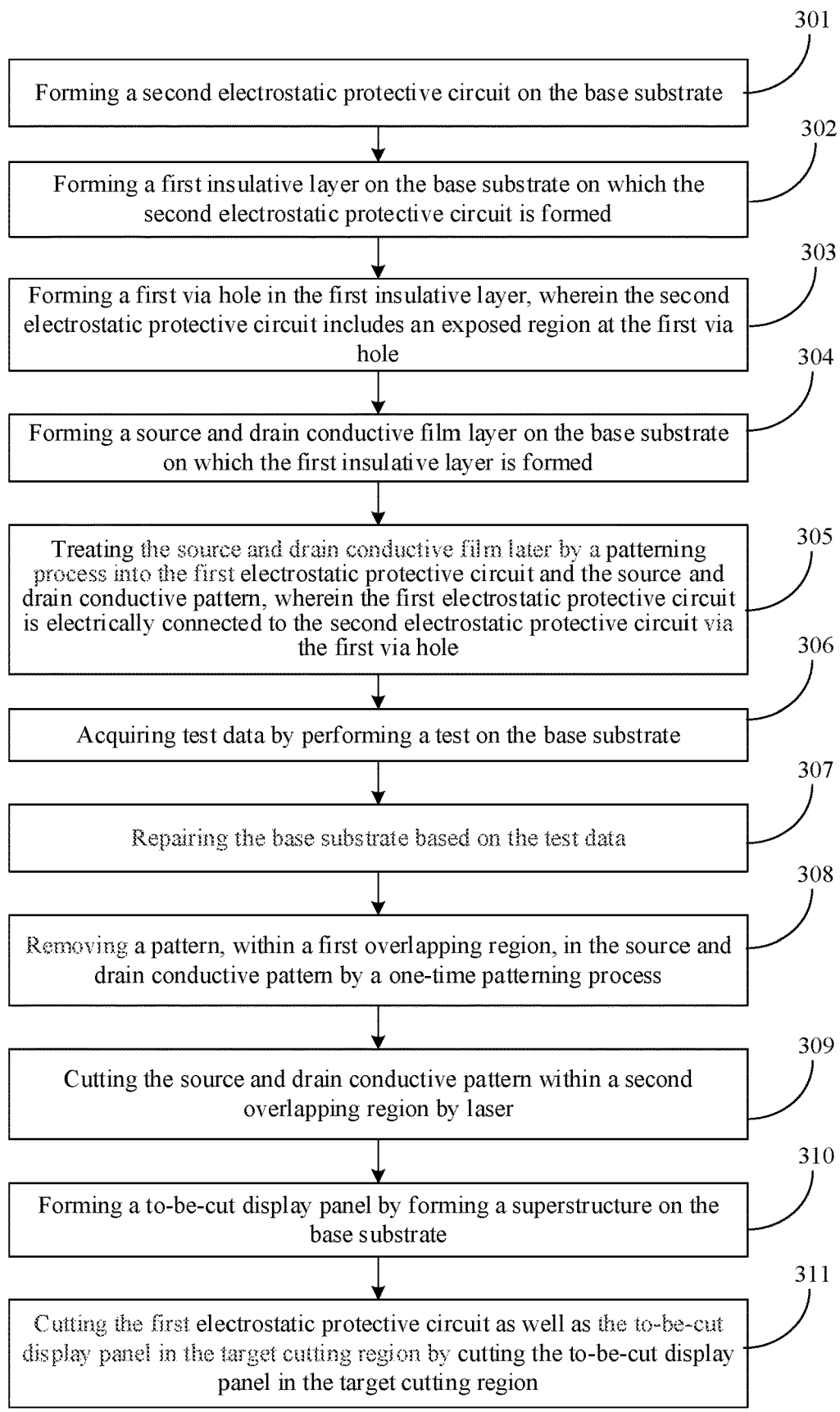
FIG. 3 is a flowchart of another method for manufacturing a display panel according to some embodiments of the present disclosure.

To make the objectives, technical solutions, and advantages of the present disclosure clearer, the following further describes implementations of the present disclosure in detail with reference to the accompanying drawings.

At present, different sizes of display panels are usually manufactured by different mask boards. For example, 55-inch display panels are manufactured by mask boards matching 55-inch, 49-inch display panels are manufactured by mask boards matching 49-inch, such that a variety of sizes of display panels can be manufactured.

However, there are many structures in display panels, and each structure requires different mask boards to be manufactured, which makes each size of display panel require a set of mask boards including multiple mask boards to be manufactured, taking a longer time to design and manufacture the mask boards and causing higher cost.

In one method, the display panel of a certain size A can be manufactured by a set of mask boards, and then the display panel can be cut into a smaller size B by panel cutting technology, such that two sizes of display panels, size A and size B, can be manufactured.

The problem of cutting the display panel come with the method. Because some lines inside the display panel (such as source and drain conductive patterns) are fragile, they are easily damaged in the process of cutting the display panel and have an impact on other adjacent lines. Thus, before cutting the display panel, such lines are pre-cut in the manufacturing process of the internal structure of the display panel.

At present, the source and drain pattern and the electrostatic protective circuit in the preset cutting region are usually removed in a patterning process, and then other structures inside the display panel are formed. Exemplarily, as shown in FIG. 1, FIG. 1 is a schematic diagram of a base substrate 13 in the related technology after removing the source and drain conductive pattern 11 and the electrostatic protective circuit 12 in the cutting region s. The base substrate 13 is provided with the electrostatic protective circuit 12, the gate line 14, and the source and drain conductive pattern 11, and the source and drain conductive pattern 11 and the electrostatic protective line 12 in the cutting region s have been removed.

The method brings a new problem, that is, after removing the electrostatic protective circuit in the cutting region of the display panel, the electrostatic protective line is difficult to perform the normal electrostatic protective function, and the subsequent formation of the structure is likely to be damaged by electrostatic (for example, the gate line and the active layer may be short-circuited due to electrostatic breakdown of the insulation layer), resulting in a low manufacturing yield of the display panel.

The embodiments of the present disclosure provide a method for manufacturing a display panel, a display panel and a to-be-cut display panel, which can solve some problems in the above related technology.

FIG. 2 is a flow chart of a method for manufacturing a display panel according to the present disclosure, which includes the following processes.

In 201, a first electrostatic protective circuit and a source and drain conductive pattern are formed on a base substrate. The base substrate includes a target cutting region. The target cutting region is overlapped with an orthographic projection of the first electrostatic protective circuit on the base substrate, and the target cutting region is overlapped with an orthographic projection of the source and drain conductive pattern on the base substrate.

In 202, the source and drain conductive pattern within the target cutting region is removed.

In 203, a to-be-cut display panel is formed by forming a superstructure on the base substrate.

In 204, the to-be-cut display panel is cut in the target cutting region.

The first electrostatic protective circuit and the source and drain conductive pattern can be the same layer structure formed by a one-time patterning process or a different layer structure formed by multiple patterning processes, which is not limited in the embodiments of the present disclosure.

In summary, in the method for manufacturing the display panel according to the embodiments of the present disclosure, when manufacturing the internal structure of the display panel, only the source and drain conductive pattern in the target cutting region is removed, while the electrostatic protective circuit in the target cutting region is retained. In this way, the electrostatic protective circuit can always play the function of electrostatic protective during the formation of the internal structure of the display panel, such that the internal structure of the display panel is avoided from being damaged by electrostatic, the manufacturing yield of the display panel improved, the problem of low manufacturing yield of the display panel in the related technology is solved, and the effect of improving the manufacturing yield of the display panel is achieved.

FIG. 3 is a flow chart of another method for manufacturing a display panel according to some embodiments of the present disclosure, which may include the following processes.

In 301, a second electrostatic protective circuit is formed on the base substrate.

The second electrostatic protective circuit is configured to cooperate with the first electrostatic protective circuit formed in a subsequent process for protective against electrostatic charges. The material of the second electrostatic protective circuit may include copper or aluminum.

Figure 4:
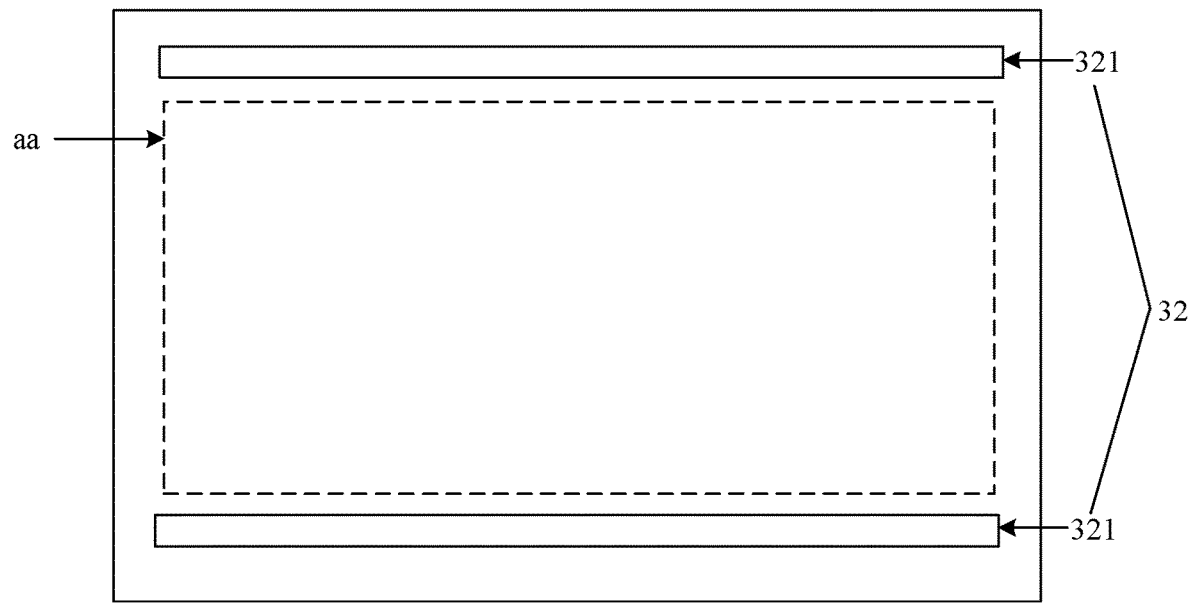
FIG. 4 is a schematic diagram of a structure of a base substrate according to the method shown in FIG. 3.

As shown in FIG. 4. FIG. 4 is a schematic diagram of a structure of a base substrate 31 at the end of process 301, the second electrostatic protective circuit 32 includes two second electrostatic protective circuits 321, and the two second electrostatic protective circuits 321 are disposed on both sides of the display region aa of the base substrate 31 respectively.

In 302, a first insulative layer is formed on the base substrate on which the second electrostatic protective circuit is formed.

The first insulative layer is configured to avoid short-circuiting between the second electrostatic protective circuit and other structures. The material of the first insulative layer includes silicon dioxide.

In 303, a first via hole is formed in the first insulative layer, wherein the second electrostatic protective circuit includes an exposed region at the first via hole.

The second electrostatic protective circuit is electrically connected to the subsequently formed first electrostatic protective circuit via the first via hole.

Optionally, the second electrostatic protective circuit includes a region exposed at the first via hole, and the region is disposed at the end of the second electrostatic protective circuit.

In 304, a source and drain conductive film layer is formed on the base substrate on which the first insulative layer is formed.

The source and drain conductive film layer is a metal film layer, for example, the metal is copper or aluminum. The source and drain conductive film layer is formed on the first insulative layer by a sputtering process or a deposition process.

In 305, the source and drain conductive film later is processed by a patterning process into the first electrostatic protective circuit and the source and drain conductive pattern, wherein the first electrostatic protective circuit is electrically connected to the second electrostatic protective circuit via the first via hole.

The source and drain conductive film layer is treated into the first electrostatic protective circuit and the source and drain conductive pattern by the one-time patterning process. The source and drain conductive pattern includes a plurality of data lines, a source electrode, a drain electrode, and other structures. The target cutting region is overlapped with the orthographic projection of the plurality of data lines on the base substrate. The first electrostatic protective circuit includes two first electrostatic protective wires, and the two first electrostatic protective wires are disposed on both sides of the source and drain conductive pattern in a first direction respectively, which is perpendicular to the length direction of the data lines.

The target cutting region is a strip region across the entire base substrate, and the target cutting region is configured to identify the region where subsequent cuts are to be made. In the embodiments of the present disclosure, the length direction of the target cutting region is parallel to the length direction of the gate lines, i.e., the plurality of data lines are cut off in the target cutting region when cutting.

In addition, the target cutting region is overlapped with the orthographic projection of the first electrostatic protective wire on the base substrate in. In the related technology, the first electrostatic protective wire and the data line in the source and drain conductive pattern are removed together in a one-time patterning process, but this leads to the structure formed subsequently without the protective of the first electrostatic protective wire and easy to be damaged by electrostatic.

In the embodiments of the present disclosure, the patterning process includes the processes of coating the photoresist, exposure, development, etching, stripping the photoresist and the like.

Figure 5:
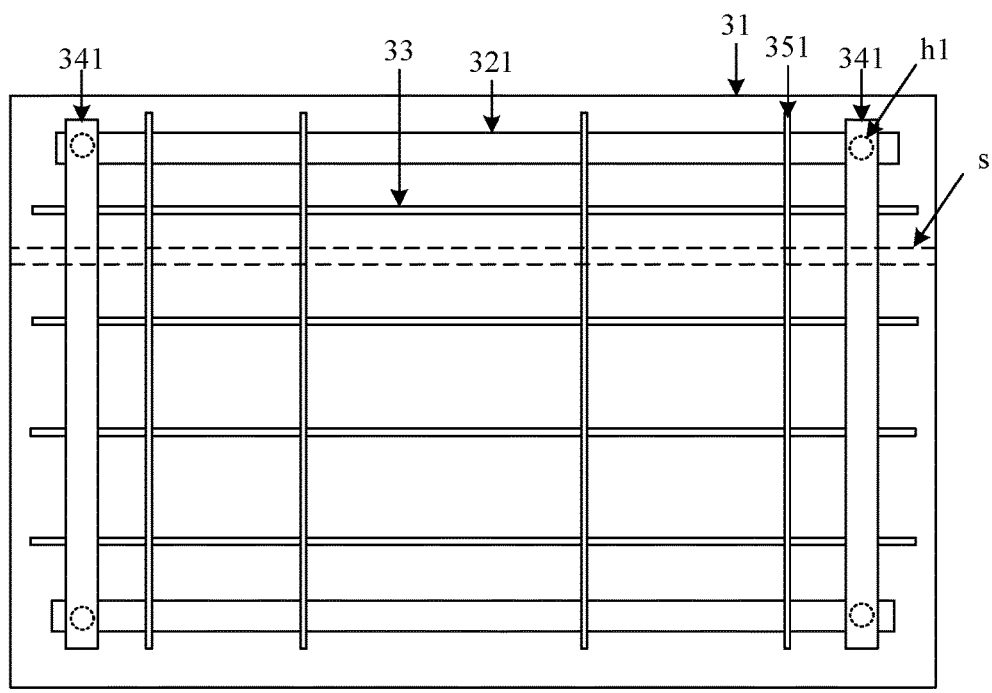
FIG. 5 is a schematic diagram of a structure of another base substrate according to the method shown in FIG. 3.

A schematic diagram of the structure of the base substrate at the end of process 305 is shown in FIG. 5. The first electrostatic protective wires 341 are electrically connected to the second electrostatic protective wires 321 via the via hole hl. And the two first electrostatic protective wires 341 and the two second electrostatic protective wires 321 enclose a rectangle to surround the structure in the base substrate 31 for the function of electrostatic protective. The data lines 351 and the first electrostatic protective wires 341 are overlapped with the target cutting region s. In addition, a plurality of gate lines 33 are formed on the base substrate 31, and the gate lines 33 are formed in the case that the second electrostatic protective wires 321 have been formed.

In 306, test data is acquired by performing a test on the base substrate.

The test includes electrical tests and optical tests, etc. For example, the performed tests include automated optical inspection (AOI), source and drain testing, etc. In the case that the test is performed, the test results is acquired, which can reflect some structural defects on the base substrate, such as disconnection of the alignment and short circuit, etc.

In 307, the base substrate is repaired based on the test data.

The test includes the repair of various defects in points and lines.

In 308, a pattern, within the first overlapping region, in the source and drain conductive pattern is removed by a one-time patterning process.

In the embodiments of the present disclosure, the base substrate includes a display region and a peripheral region disposed at a periphery of the display region, and the first overlapping region is the overlapping region between the display region and the target cutting region. The peripheral region also includes a part of the source region conductive pattern. However, the source and drain pattern is too close to the first electrostatic protective circuit. In the case that the source and drain pattern in the peripheral region is removed by the patterning process, it may cause damage to the first electrostatic protective circuit. In this way, in the embodiments of the present disclosure, only the source and drain pattern in the display region is removed by a one-time patterning process.

Optionally, because the data lines in the first overlapping region in the source and drain conductive pattern can be removed by a one-time patterning process, the damage to the lines in the display panel is reduced.

Figure 6:
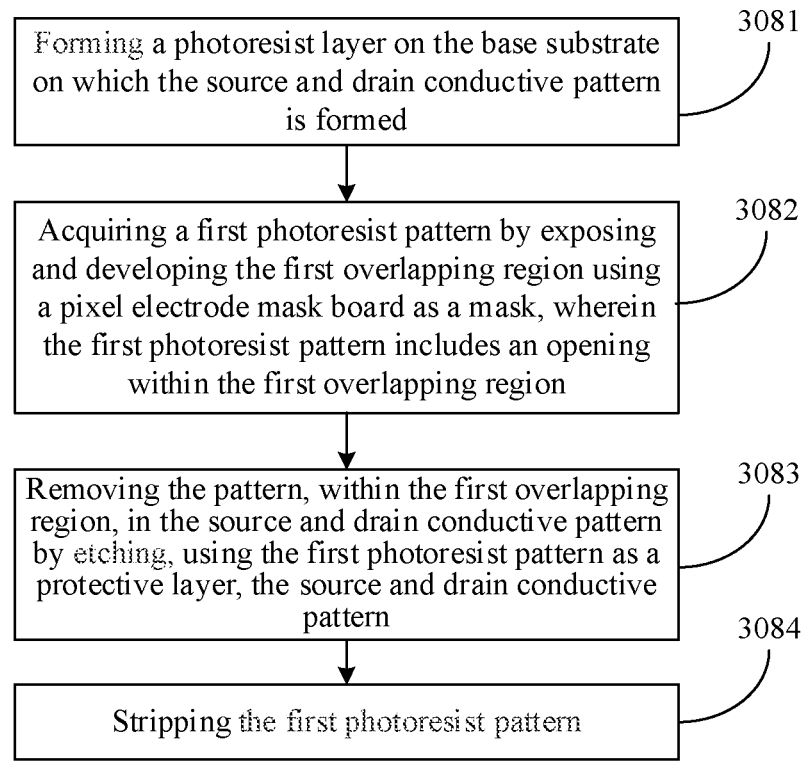
FIG. 6 is a flow diagram of a method for removing a source and drain conductive pattern in the embodiments shown in FIG. 3.

Optionally, as shown in FIG. 6, process 308 includes the following sub-processes.

In 3081, a photoresist layer is formed on the base substrate on which the source and drain conductive pattern is formed.

The photoresist layer is formed by a coating process.

In 3082, a first photoresist pattern is acquired by exposing and developing the first overlapping region using a pixel electrode mask board as a mask, wherein the first photoresist pattern includes an opening within the first overlapping region.

The pixel electrode mask board is a mask board configured to form a pixel electrode. The mask board has an opening at the position of the data line, and the pixel electrode mask board is used as a mask, and then the irradiation region of the light can be adjusted, such that the light only irradiates the first overlapping region and its surrounding region to expose the first overlapping region. Then the development is performed to acquire a first photoresist pattern with an opening within the first overlapping region. The first photoresist pattern with openings within the first overlapping region is developed. In this way, the method provided in the disclosure is realized by using an existing mask board without adding a new mask board, reducing the process and manufacturing costs.

Optionally, the pixel electrode mask board includes a baffle by which masking can be performed to expose the first overlapping region.

In 3083, the pattern, within the first overlapping region, in the source and drain conductive pattern is removed by etching, using the first photoresist pattern as a protective layer, the source and drain conductive pattern.

In the case that the first photoresist pattern is acquired, the source and drain conductive pattern is etched to remove the pattern, within the first overlapping region, in the source and drain conductive pattern.

In 3084, the first photoresist pattern is stripped.

The first photoresist pattern is stripped by a stripping process.

Figure 7:
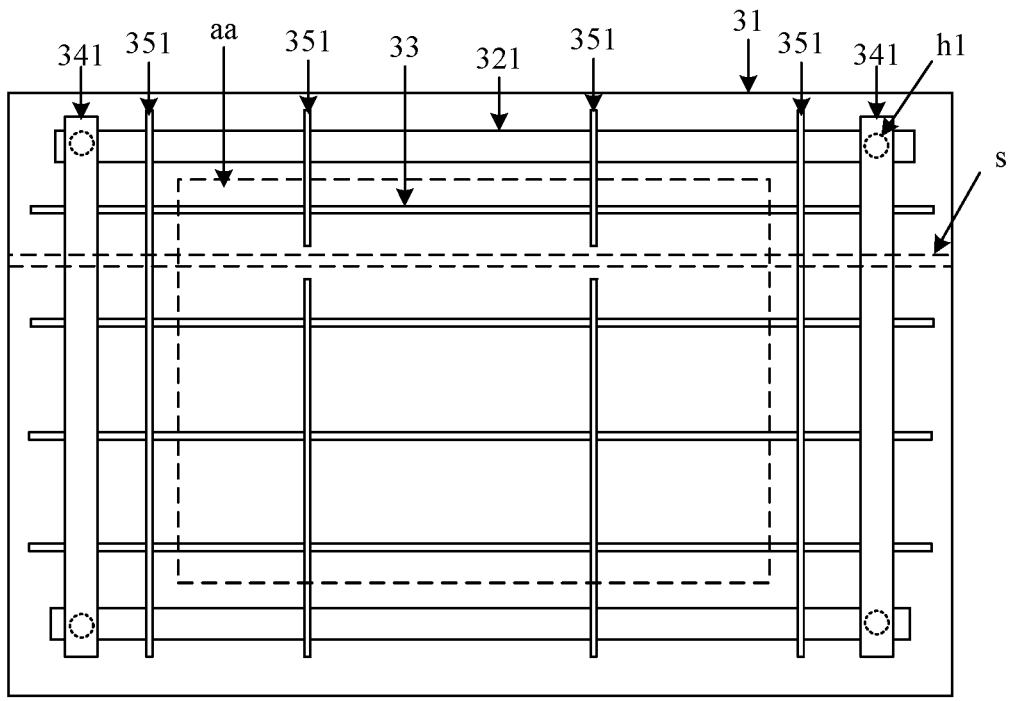
FIG. 7 is a schematic diagram of a structure of another base substrate according to the method shown in FIG. 3.

The diagram of the structure of the base substrate at the end of process 308 is shown in FIG. 7. The portion of the data line 351 in the source and drain conductive pattern in the target cut region s and in the display region aa is removed, and the data line 351 adjacent to the first electrostatic protective circuit remains intact.

In 309, the source and drain conductive pattern within a second overlapping region is cut by laser.

The second overlapping region is an overlapping region between the peripheral region and the target cutting region. The laser process is more accurate and is configured to cut source and drain conductive patterns in the second overlapping region of the source and drain conductive pattern.

Figure 8:
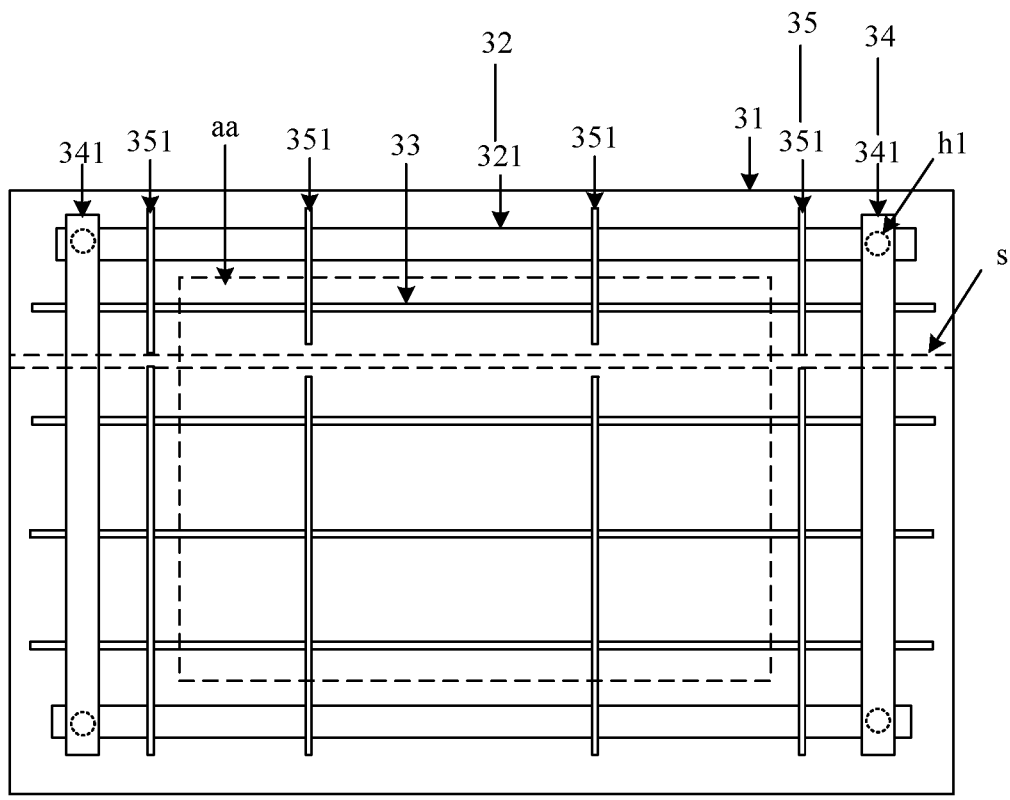
FIG. 8 is a schematic diagram of a structure of another base substrate according to the method shown in FIG. 3.

The diagram of the structure of the base substrate at the end of process 309 is shown in FIG. 8. The data lines 351 in the source and drain conductive pattern within the target cut region s and within the peripheral region outside the display region aa are cut.

In 310, a to-be-cut display panel is formed by forming a superstructure on the base substrate.

The superstructure includes various structures for display functions, such as passivation layers (the material can be silicon oxide ($SiO_x$), and the thickness can be 3000 Å to 5000 Å), color film layers, light-emitting layers, pixel electrodes, and encapsulation layers, etc., which are not limited in the embodiments of the present disclosure. In the case that the superstructure is formed, the to-be-cut display panel is acquired. The size of the to-be-cut display panel is large, for example, 55 inches.

In 311, the first electrostatic protective circuit as well as the to-be-cut display panel are cut in the target cutting region by cutting the to-be-cut display panel in the target cutting region.

The to-be-cut display panel is cut in the target cutting region by a laser cutting process or a cutter wheel cutting process, such that the first electrostatic protective circuit and the to-be-cut display panel is cut in the target cutting region. That is, in the method for manufacturing the display panel provided by the embodiments of present disclosure, the first electrostatic protective circuit is complete until the display panel is cut, and the electrostatic protective function can be realized normally, which avoids the damage of lines in the display panel by electrostatic, and improves the manufacturing yield of the display panel.

In the embodiments of present disclosure, the provided schematic diagram of the structure is a top view of the base substrate or display panel. The top view is observed from the top direction of the base substrate to the base substrate. In order to clearly show the structure on the base substrate, some structures are omitted in the above attached drawings.

Figure 9:
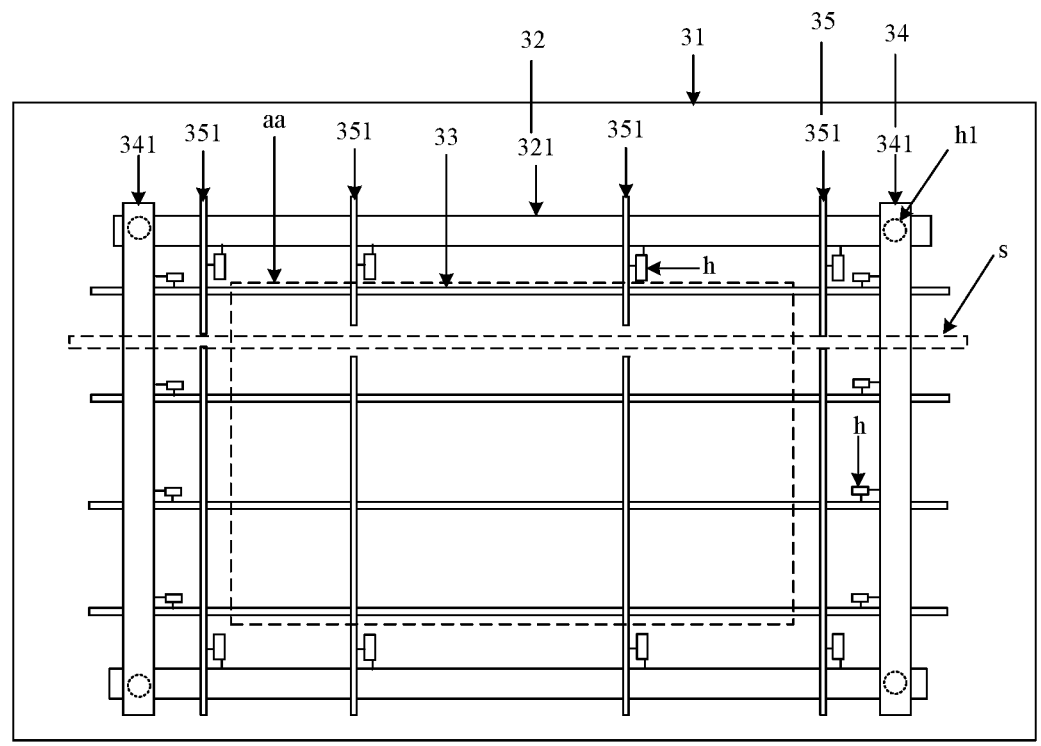
FIG. 9 is a schematic diagram of the structure of a display panel according to some embodiments of the present disclosure.

For example, as shown in FIG. 9, a schematic diagram of a structure of a display panel manufactured by the method for manufacturing the display panel according to some embodiments of the present disclosure is shown. The display panel includes a plurality of electrostatic rings h. One end of the electrostatic ring h is electrically connected to the first electrostatic protective circuit 34 or the second electrostatic protective circuit 32, and the other end of the electrostatic ring h is electrically connected to the gate line 33 or the data line 351, such that the effect of electrostatic forces on the gate line 33 or the data line 351 is reduced.

In the embodiments of present disclosure, the first electrostatic protective circuit and the second electrostatic protective circuit belong to the electro-static discharge busline (ESD Busline). The ESD busline further includes other structures, such as power supplies and electrostatic discharge circuits, which are not described the embodiments of present disclosure.

Two smaller display panels are acquired by cutting. Exemplarily, one of the display panels is 49 inches in size.

In summary, in the method for manufacturing the display panel according to the embodiments of the present disclosure, when manufacturing the internal structure of the display panel, only the source and drain conductive pattern in the target cutting region is removed, while the electrostatic protective circuit in the target cutting region is retained. In this way, the electrostatic protective circuit can always play the function of electrostatic protective during the formation of the internal structure of the display panel, such that the internal structure of the display panel is avoided from being damaged by electrostatic, the manufacturing yield of the display panel improved, the problem of low manufacturing yield of the display panel in the related technology is solved, and the effect of improving the manufacturing yield of the display panel is achieved.

The above processes 308 and 309 provide an optional method for avoiding damage to the first electrostatic protective circuitry when removing the source and drain conductive pattern in the target cut region. However, embodiments of the present disclosure may also remove the source and drain conductive pattern in the target cutting region in other ways. Exemplarily, a process for removing the source and drain conductive pattern in the target cut region includes the follows.

1) A portion of the first data line of the plurality of data lines within the target cutting region is removed by a one-time patterning process.

The first data line is the data line of the plurality of data lines that has a minimum distance from the first electrostatic protective circuit greater than a specified value, that is, only the portion of the data line within the target cutting region that is farther from the first electrostatic protective circuit is removed by the patterning process, such that the damage of the patterning process to the first electrostatic protective circuit is avoided. The minimum distance is determined by the accuracy of the patterning process, for example, the higher the accuracy of the patterning process, the smaller the minimum distance is.

In addition, the data line is parallel to the line of the first electrostatic protective circuit, and the distance between the data line and the first electrostatic protective circuit is identical everywhere.

2) A portion of the plurality of data lines other than the first data line within the target cutting region is removed by laser.

Later, the portion of the plurality of data lines other than the first data line within the target cutting region is removed by a laser with high precision.

Figure 10:
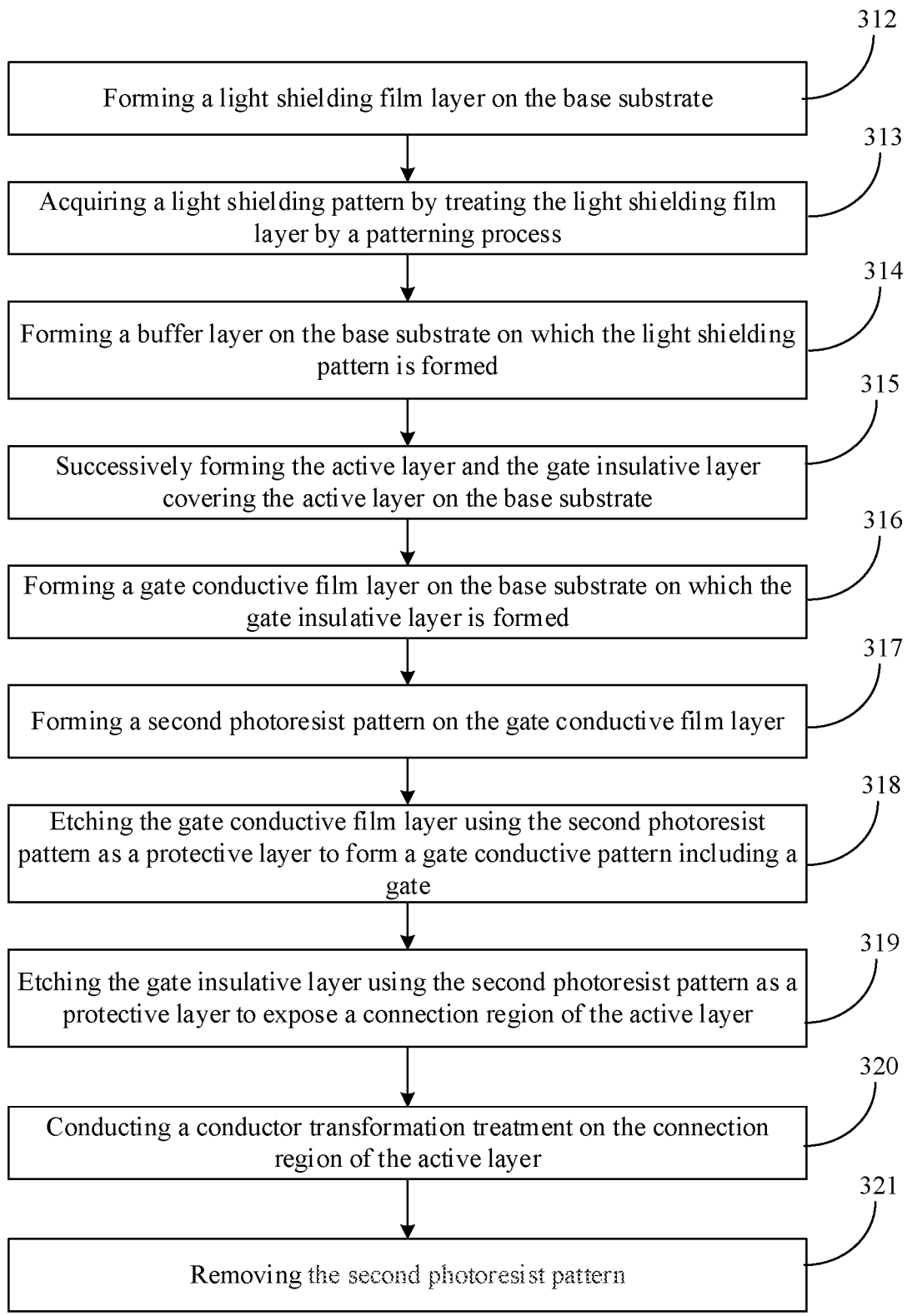
FIG. 10 is a flowchart of another method for manufacturing a display panel according to some embodiments of the present disclosure.

Optionally, as shown in FIG. 10, process 304 of the above embodiments is preceded by the following processes.

In 312, a light shielding film layer is formed on the base substrate.

The light shielding film layer can be a metal light shielding film layer, such as a molybdenum layer, or a composite film layer of molybdenum and aluminum. The thickness of the light shielding film layer ranges from 1000 Å to 2000 Å.

In 313, a light shielding pattern is acquired by treating the light shielding film layer by a patterning process.

The light shielding pattern includes a light shielding region and an opening region. The light shielding region is configured to shade light from a side, distal from the light shielding film layer, of the base substrate into the display panel, and avoid affecting the structure inside the display panel (such as the active layer).

In 314, a buffer layer is formed on the base substrate on which the light shielding pattern is formed.

The material for the buffer layer includes silicon oxide ($SiO_x$), which can be formed by plasma enhanced chemical vapor deposition (PECVD) technology.

In 315, the active layer and the gate insulative layer covering the active layer are formed successively on the base substrate.

The material of the active layer can include metal oxides, such as indium gallium zinc oxide (IGZO).

An orthographic projection of the active layer on the base substrate is within an orthographic projection of the light shielding region of the light shielding pattern on the base substrate.

Figure 11:
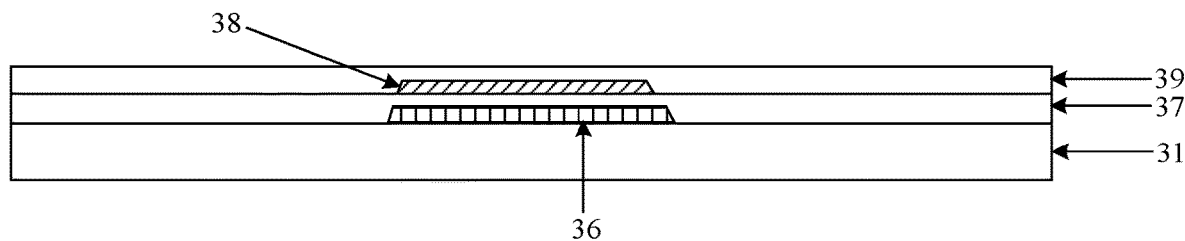
FIG. 11 is a schematic diagram of a structure of a base substrate according to the method shown in FIG. 10.

A schematic diagram of the structure of the base substrate at the end of process 315 is shown in FIG. 11. The base substrate 31 is formed successively with a light shielding pattern 36, a buffer layer 37, an active layer 38, and a gate insulative layer 39.

In 316, a gate conductive film layer is formed on the base substrate on which the gate insulative layer is formed.

The gate conductive film layer is a metal film layer, and the material of the gate conductive film layer includes copper or aluminum. The gate conductive layer may be formed by a sputtering process or a deposition process.

In 317, a second photoresist pattern is formed on the gate conductive film layer.

A photoresist layer is formed on the gate conductive film layer by a coating process, and the photoresist layer is exposed and developed using a mask template as a mask to form a second photoresist pattern.

In 318, the gate conductive film layer is etched using the second photoresist pattern as a protective layer to form a gate conductive pattern including a gate.

The gate conductive film layer is etched using the second photoresist pattern as a protective layer, such that the gate conductive pattern including gate and gate lines is formed.

The orthographic projection of the gate on the base substrate is within the orthographic projection of the active layer on the base substrate.

Figure 12:
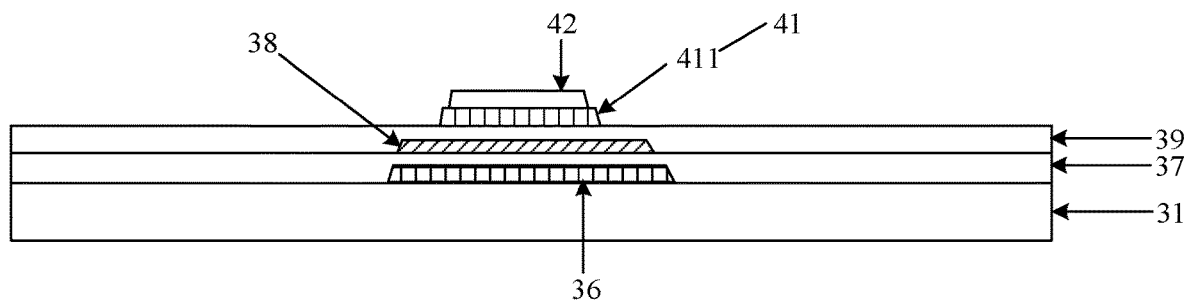
FIG. 12 is a schematic diagram of a structure of another base substrate according to the method shown in FIG. 10.

A schematic diagram of the structure of the base substrate at the end of process 318 is shown in FIG. 12. The gate 411 of the gate conductive pattern 41 is disposed on the gate insulative layer 39, and the second photoresist pattern 42 is formed on the gate 411.

In 319, the gate insulative layer is etched using the second photoresist pattern as a protective layer to expose a connection region of the active layer.

The gate insulative layer continues to be etched using the second photoresist pattern as a protective layer to expose the connection region of the active layer. The orthographic projection of the connection region on the base substrate is not overlapped with the orthographic projection of the gate on the base substrate. The connection region is configured to contact the subsequently formed source and drain electrode.

Figure 13:
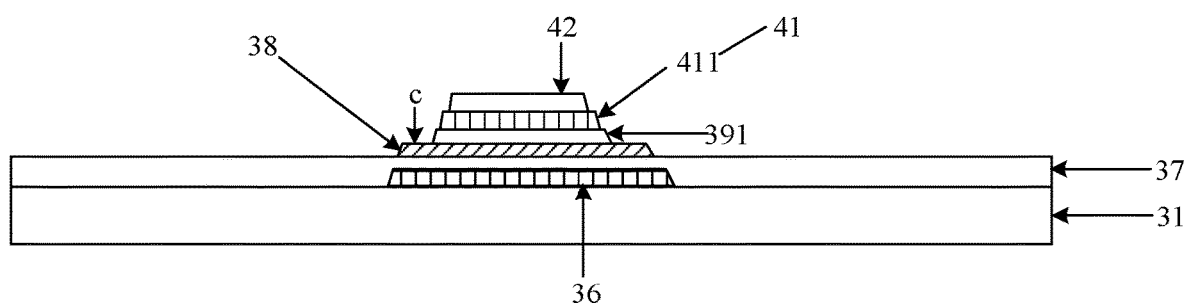
FIG. 13 is a schematic diagram of a structure of another base substrate according to the method shown in FIG. 10.

A schematic of the structure of the base substrate at the end of process 319 is shown in FIG. 13. In the case that the gate insulative layer is etched, an insulative spacer 391 is formed and the connection region e of the active layer 38 is exposed.

In 320, a conductor transformation treatment is conducted on the connection region of the active layer.

The conductor transformation treatment enhances the electrical conductivity of the connection region of the active layer, such that the connection region is electrically connected to the subsequently formed source and drain electrode. Exemplarily, in the case that the material of the active layer is IGZO, the conductor transformation treatment includes treating the surface of the IGZO with a hydrogen-containing gas, such that the oxygen in the IGZO is combined with the hydrogen and the conductor transformation treatment is conducted on the IGZO.

The connection region is disposed at the ends of the active layer, and a trench layer is disposed between the ends of the active layer for conducting the source and drain electrode under the control of the gate.

In 321, the second photoresist pattern is removed.

The second photoresist pattern is removed by stripping process.

Figure 14:
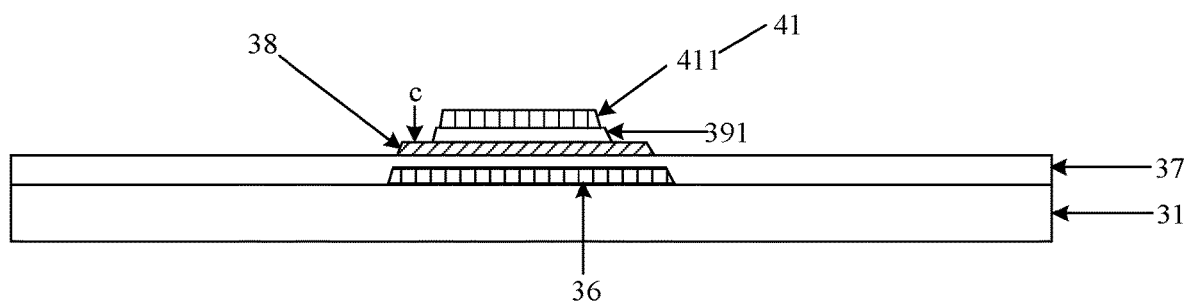
FIG. 14 is a schematic diagram of a structure of another base substrate according to the method shown in FIG. 10.

A schematic diagram of the structure of the base substrate at the end of process 321 is shown in FIG. 14. The connection region c of the active layer 38 is conducted by the conductor transformation treatment and has a high conductivity, which is configured to contact with the base subsequently formed source and drain electrode.

In the embodiment shown in FIG. 10, the provided structure schematic is a sectional view, and the section surface is a surface perpendicular to the base substrate in the display region of the base substrate.

In addition, as shown in FIG. 9, embodiments of the present disclosure further provide a to-be-cut display panel, the to-be-cut display panel includes:

a base substrate 31, including a target cutting region s;

a first electrostatic protective circuit 34 and a source and drain conductive pattern 35 disposed on the base substrate 31, wherein the target cut region s is overlapped with an orthographic projection of the first electrostatic protective circuit 34 on the base substrate 31, and the target cut region s is not overlapped with an orthographic projection of the source and drain conductive pattern 35 on the base substrate 31: and a superstructure disposed on the first electrostatic protective circuit 34 and the source and drain conductive pattern 35 (the superstructure is not shown in FIG. 7 in order to clearly illustrate other structures).

Optionally, the to-be-cut display panel further includes a second electrostatic protective circuit 32. The second electrostatic protective circuit 32 is electrically connected to the first electrostatic protective circuit 34.

In summary, in the to-be-cut display panel according to the embodiments of the present disclosure, the electrostatic protective circuit in the target cutting region is retained. In this way, the electrostatic protective circuit can always play the function of electrostatic protective during the formation of the internal structure of the display panel, such that the internal structure of the display panel is avoided from being damaged by electrostatic, the manufacturing yield of the display panel improved, the problem of low manufacturing yield of the display panel in the related technology is solved, and the effect of improving the manufacturing yield of the display panel is achieved.

In another aspect, a display panel is provided. The display panel includes a display panel manufactured by any of the above methods. For example, the display panel is the display panel acquired by cutting the to-be-cut display panel as shown in FIG. 9 in the target cutting region.

It should be noted that in the accompanying drawings, the dimensions of the layers and regions may be exaggerated for clarity of illustration. It is understood that when an element or layer is referred to as being "on" another element or layer, it may be directly on the other component, or there is an intermediate layer. It is also understood that when an element or layer is referred to as being "under" another element or layer, it may be directly under other elements, or there is more than one intermediate layer or element. It is also understood that when a layer or element is referred to as being "between" two layers or elements, it may be the only layer between the two layers or elements, or there is more than one intermediate layer or element. Similar reference marks throughout indicate similar elements.

In the present disclosure, the terms "first" and "second" are only used to describe purposes and are not to be understood as indicating or implying relative importance. The term "plurality" refers to two or more, unless expressly limited.

The above descriptions are merely optional embodiments of the present disclosure, but are not intended to limit the present disclosure. Any modification, equivalent replacement, or improvement made without departing from the spirit and principle of the present disclosure shall fall within the protective scope of the present disclosure.

What is claimed is:

1. A method for manufacturing a display panel, comprising:
    forming a first electrostatic protective circuit and a source and drain conductive pattern on a base substrate, the base substrate comprising a target cutting region, wherein the target cutting region is overlapped with an orthographic projection of the first electrostatic protective circuit on the base substrate, and the target cutting region is overlapped with an orthographic projection of the source and drain conductive pattern on the base substrate;
    removing the source and drain conductive pattern within the target cutting region;
    forming a to-be-cut display panel by forming a superstructure on the base substrate; and
    cutting the to-be-cut display panel in the target cutting region;
    wherein prior to forming the first electrostatic protective circuit and the source and drain conductive pattern on the base substrate, the method further comprises:
    forming a second electrostatic protective circuit on the base substrate; and
    wherein forming the first electrostatic protective circuit and the source and drain conductive pattern on the base substrate comprises:
    forming a first insulative layer on the base substrate on which the second electrostatic protective circuit is formed;
    forming a first via hole in the first insulative layer, wherein the second electrostatic protective circuit comprises an exposed region at the first via hole;
    forming a source and drain conductive film layer on the base substrate on which the first insulative layer is formed; and
    treating the source and drain conductive film layer by a patterning process into the first electrostatic protective circuit and the source and drain conductive pattern, wherein the first electrostatic protective circuit is electrically connected to the second electrostatic protective circuit via the first via hole.

2. The method according to claim 1, wherein
    the base substrate comprises a display region and a peripheral region disposed at a periphery of the display region; and
    removing the source and drain conductive pattern within the target cutting region comprises:
    removing a portion, within a first overlapping region, of the source and drain conductive pattern, wherein the first overlapping region is an overlapping region between the display region and the target cutting region; and
    removing a portion, within a second overlapping region, of the source and drain conductive pattern by laser, wherein the second overlapping region is an overlapping region between the peripheral region and the target cutting region.

3. The method according to claim 2, wherein removing the portion, within the first overlapping region, of the source and drain conductive pattern comprises:
    removing the portion, within the first overlapping region, of the source and drain conductive pattern by a one-time patterning process.

4. The method according to claim 3, wherein removing the portion, within the first overlapping region, of the source and drain conductive pattern by the one-time patterning process comprises:
    forming a photoresist layer on the base substrate on which the source and drain conductive pattern is formed;
    acquiring a first photoresist pattern by exposing and developing, using a pixel electrode mask plate as a mask, the first overlapping region, wherein the first photoresist pattern comprises an opening within the first overlapping region;
    removing the portion, within the first overlapping region, of the source and drain conductive pattern by etching, using the first photoresist pattern as a protective layer, the source and drain conductive pattern; and
    stripping the first photoresist pattern.

5. The method according to claim 1, wherein
    the source and drain conductive pattern comprises a plurality of data lines arranged in a first direction, wherein the target cutting region is overlapped with orthographic projections of the plurality of data lines on the base substrate, and the first electrostatic protective circuit is disposed on both sides of the plurality of data lines in the first direction; and
    removing the source and drain conductive pattern within the target cutting region comprises:
    removing a portion of a first data line, within the target cutting region, of the plurality of data lines by a one-time patterning process, wherein the first data line is a data line, of the plurality of data lines, having a minimum distance from the first electrostatic protective circuit that is greater than a specified value; and
    removing portions, within the target cutting region, of the other data lines other than the first data line of the plurality of data lines by laser.

6. The method according to claim 2, wherein
    the source and drain conductive pattern comprises a plurality of data lines, wherein the target cutting region is overlapped with orthographic projections of the plurality of data lines on the base substrate; and
    removing the portion, within the first overlapping region, of the source and drain conductive pattern comprises:

removing data lines, within the first overlapping region, of the source and drain conductive pattern.

7. The method according to claim 1, wherein prior to removing the source and drain conductive pattern within the target cutting region, the method further comprises:
   acquiring test data by performing a test on the base substrate; and
   repairing the base substrate based on the test data.

8. The method according to claim 1, wherein forming the first electrostatic protective circuit and the source and drain conductive pattern on the base substrate comprises:
   forming a source and drain conductive film layer on the base substrate; and
   treating the source and drain conductive film layer into the first electrostatic protective circuit and the source and drain conductive pattern by a one-time patterning process.

9. The method according to claim 1, wherein cutting the to-be-cut display panel in the target cutting region comprises:
   cutting the first electrostatic protective circuit as well as the to-be-cut display panel in the target cutting region by cutting the to-be-cut display panel in the target cutting region.

10. The method according to claim 1, wherein prior to forming the first electrostatic protective circuit and the source and drain conductive pattern on the base substrate, the method further comprises:
    successively forming an active layer and a gate insulative layer covering the active layer on the base substrate;
    forming a gate conductive film layer on the base substrate on which the gate insulative layer is formed;
    forming a second photoresist pattern on the gate conductive film layer;
    forming a gate conductive pattern comprising a gate by etching the gate conductive film layer using the second photoresist pattern as a protective layer, wherein an orthographic projection of the gate on the base substrate is within an orthographic projection of the active layer on the base substrate;
    exposing a connection region of the active layer by etching the gate insulative layer using the second photoresist pattern as a protective layer, wherein an orthographic projection of the connection region on the base substrate is not overlapped with the orthographic projection of gate on the base substrate;
    conducting a conductor transformation treatment on the connection region of the active layer; and
    removing the second photoresist pattern.

11. The method according to claim 10, wherein prior to successively forming the active layer and the gate insulative layer covering the active layer on the base substrate, the method further comprises:
    forming a light shielding film layer on the base substrate;
    acquiring a light shielding pattern by treating the light shielding film layer by a patterning process, wherein the light shielding pattern comprises a light shielding region and an opening region; and
    forming a buffer layer on the base substrate on which the light shielding pattern is formed;
    wherein successively forming the active layer and the gate insulative layer covering the active layer on the base substrate comprises:
    successively forming the active layer and the gate insulative layer covering the active layer on the buffer layer, wherein an orthographic projection of the active layer on the base substrate is within an orthographic projection of the light shielding region of the light shielding pattern on the base substrate.

12. A display panel, wherein the display panel is manufactured by the method of claim 1 comprising: a display panel manufactured by the method as defined in claim 1.

13. The method according to claim 2, wherein forming the first electrostatic protective circuit and the source and drain conductive pattern on the base substrate comprises:
    forming a source and drain conductive film layer on the base substrate; and
    treating the source and drain conductive film layer into the first electrostatic protective circuit and the source and drain conductive pattern by a one-time patterning process.

14. The method according to claim 3, wherein forming the first electrostatic protective circuit and the source and drain conductive pattern on the base substrate comprises:
    forming a source and drain conductive film layer on the base substrate; and
    treating the source and drain conductive film layer into the first electrostatic protective circuit and the source and drain conductive pattern by a one-time patterning process.

15. The method according to claim 4, wherein forming the first electrostatic protective circuit and the source and drain conductive pattern on the base substrate comprises:
    forming a source and drain conductive film layer on the base substrate; and
    treating the source and drain conductive film layer into the first electrostatic protective circuit and the source and drain conductive pattern by a one-time patterning process.

16. The method according to claim 5, wherein forming the first electrostatic protective circuit and the source and drain conductive pattern on the base substrate comprises:
    forming a source and drain conductive film layer on the base substrate; and
    treating the source and drain conductive film layer into the first electrostatic protective circuit and the source and drain conductive pattern by a one-time patterning process.

17. The method according to claim 6, wherein forming the first electrostatic protective circuit and the source and drain conductive pattern on the base substrate comprises:
    forming a source and drain conductive film layer on the base substrate; and
    treating the source and drain conductive film layer into the first electrostatic protective circuit and the source and drain conductive pattern by a one-time patterning process.

* * * * *